United States Patent
Yan

(10) Patent No.: US 7,534,532 B2
(45) Date of Patent: May 19, 2009

(54) METHOD TO CORRECT EUVL MASK SUBSTRATE NON-FLATNESS

(75) Inventor: Pei-Yang Yan, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 804 days.

(21) Appl. No.: 11/045,724

(22) Filed: Jan. 27, 2005

(65) Prior Publication Data

US 2006/0166109 A1    Jul. 27, 2006

(51) Int. Cl.
    G03F 9/00    (2006.01)
(52) U.S. Cl. .................. 430/5; 716/19; 716/21
(58) Field of Classification Search ......... 430/5, 430/311; 716/19
    See application file for complete search history.

(56) References Cited

U.S. PATENT DOCUMENTS 6,028,953 A * 2/2000 Nakamura et al. ............ 430/5
6,821,682 B1 * 11/2004 Stearns et al. ................ 430/5
2003/0039923 A1 * 2/2003 Mangat et al. ............ 430/312
2004/0241557 A1 * 12/2004 Bellman et al. ............... 430/5

* cited by examiner

Primary Examiner—Mark F Huff
Assistant Examiner—Rashid Alam
(74) Attorney, Agent, or Firm—Blakley, Sokoloff, Taylor & Zafman LLP

(57) ABSTRACT

Methods to correct a non-flatness of a mask substrate are described. At least a pair of correction layers are formed on the substrate over a non-flat region of a front surface of a substrate. A thickness of the at least the pair of the correction layers is determined by a peak-to-valley distance of the non-flat region of the substrate. A portion of the correction layers over the non-flat region is heated locally. Heating changes the thickness of the portion of the correction layers and removes the non-flat region from a top surface of the correction layers without physically removing any materials. At least the pair of the correction layers is formed on a back surface of the substrate to compensate for a stress induced by the correction layers on the front surface of the substrate.

18 Claims, 11 Drawing Sheets

METHOD TO CORRECT EUVL MASK SUBSTRATE NON-FLATNESS

FIELD

Embodiments of the invention relate generally to the field of mask manufacturing, and more specifically, to methods of correcting non-flatness of a substrate of a mask and a mask substrate fabricated using such methods.

BACKGROUND

Lithography is a process by which patterns are created on a chip on a semiconductor wafer. For the last several decades, optical projection lithography has been the lithographic technique used in the high-volume manufacturing of integrated circuits. Over time, feature sizes on chips are getting smaller that requires more and more sophisticated lithography technologies, which enable to print such small features. In order to print ever smaller features of the patterns defining integrated circuits onto semiconductor wafers, the wavelength of the light used to project image of a pattern onto the wafer is continuously reduced. Extreme Ultraviolet lithography ("EUVL") is one of the lithography technologies, which employs short wavelength radiation ("light") in the approximate range of 10 nanometers ("nm") to 14 nm that enables to print features having a size smaller than 100 nm. Because extreme ultraviolet ("EUV") radiation is absorbed in almost all materials, a mask used in the EUVL is a reflective mask. The reflective mask, to transfer a pattern onto the wafer, reflects the radiation in certain regions and absorbs the radiation in other regions of the mask. Typical EUVL reflective mask blank includes a mirror deposited on a substrate, wherein the mirror consists of alternating layers of silicon and molybdenum, to maximize reflectivity of the light. The mirror of the EUVL mask blank is coated with a layer of an absorbing material. The absorbing material is patterned in a specific way to produce a mask. Typical factors that contribute to pattern displacement errors in printing a pattern onto a wafer include non-flatness of a substrate of a mask, variation of the thickness of the substrate of the mask, deformation of the mask due to stress induced by various layers deposited on the substrate of the mask, for example, reflective layers, a buffer layer, and an absorber layer. The use of EUV light and reflectance to print the patterns impose strict requirements on the quality and flatness of the substrate and the mask to reduce such errors. Current EUVL standard ("SEMI P37") for a substrate for the EUVL mask specifies that the substrate frontside and backside non-flatness be no more than 50 nm peak-to-valley ("p-v").

FIGS. 1A to 1C illustrate various types of a non-flatness of a substrate of a mask. FIG. 1A is a cross-sectional view 100 of the substrate 101, wherein the non-flatness of the substrate 101 has a shape of a slope 103 gradually extending from one part 102 of the front surface to the other part 104 of the front surface of the substrate 101. FIG. 1B is a cross-sectional view 110 of the substrate 111 of the mask, wherein the non-flatness is a bump defect 113, which lifts a portion of the front surface 112 of the substrate 111 relative to the other portions of the front surface 112. FIG. 1C is a cross-sectional view 120 of the substrate 121 of the mask, wherein both the front surface 122 and a back surface 123 of the substrate 121 have non-flatness portions. Each of the front surface 122 and the back surface 123 has a bump defect 124 and a depression defect 125, as shown in FIG. 1C.

Present polishing techniques can reduce non-flatness of the substrate down to 100 nm p-v. To further reduce non-flatness of the substrate, magnetorheological finishing ("MRF") and ion beam figuring ("IBF") are used. Each of MRF and IBF methods, however, involves removing physically of a material of the substrate that destroys a surface of a substrate and increases the roughness of the surface of the substrate at least by a factor of 5. For example, the roughness of the surface of the substrate may be higher than the 0.15 nm rms value specified in SEMI-P37 standard, as a result of using these method. The increased roughness of the substrate increases scattering of the light from the mask, reduces the reflectivity of the mask, and results in errors in printing the pattern onto the wafer. Also, neither MRF, nor IBF removes the local defects having a size smaller than 50 nm from the substrate. In addition, both the MRF and the IBF methods require high precision surface non-flatness measuring equipment to perform the correction. For the MRF and the IBF methods, correcting a surface non-flatness is performed through series of iterations, wherein each iteration involves measuring the size of the non-flatness via high precision interferometer, physically removing a portion of the surface material, then measuring the non-flatness in the same location again. Typically, it requires many iterations to correct the non-flatness in a single location on the surface. Each of the MRF and IBF methods is time consuming that significantly reduces throughput for a mask manufacturing and is also very expensive.

BRIEF DESCRIPTION OF THE DRAWINGS

The invention may be best understood by referring to the following description and accompanying drawings that are used to illustrate embodiments of the invention. In the drawings.

DETAILED DESCRIPTION

Figure 1A:
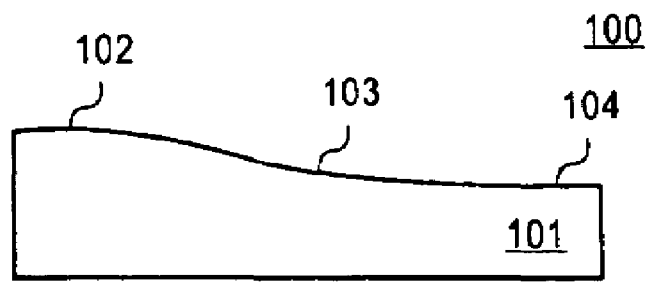
FIGS. 1A to 1C illustrate various types of a non-flatness of a substrate of a mask.
Figure 1B:
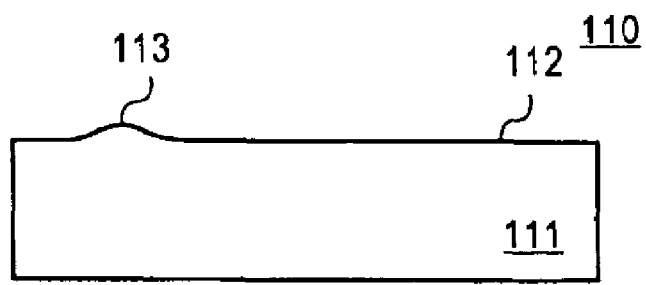
Figure 1C:
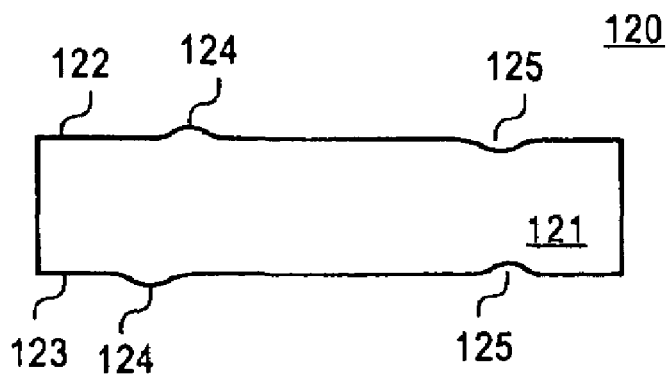

In the following description, numerous specific details, such as specific materials, dimensions of the elements, temperatures, time, wavelengths, etc. are set forth in order to provide thorough understanding of one or more of the embodiments of the present invention. It will be apparent, however, to one of ordinary skill in the art that the one or more embodiments of the present invention may be practiced without these specific details. In other instances, mask fabrication processes, techniques, materials, equipment, etc., have not been described in great details to avoid unnecessarily obscuring of this description. Those of ordinary skill in the art, with the included description, will be able to implement appropriate functionality without undue experimentation.

While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art.

Reference throughout the specification to "one embodiment", "another embodiment", or "an embodiment" means that a particular feature, structure, or characteristic described in connection with the embodiment is included in at least one embodiment of the present invention. Thus, the appearance of the phrases "for one embodiment" or "for an embodiment" in various places throughout the specification are not necessarily all referring to the same embodiment. Furthermore, the particular features, structures, or characteristics may be combined in any suitable manner in one or more embodiments.

Moreover, inventive aspects lie in less than all the features of a single disclosed embodiment. Thus, the claims following the Detailed Description are hereby expressly incorporated into this Detailed Description, with each claim standing on its own as a separate embodiment of this invention. While the invention has been described in terms of several embodiments, those skilled in the art will recognize that the invention is not limited to the embodiments described, but can be practiced with modification and alteration within the spirit and scope of the appended claims. The description is thus to be regarded as illustrative rather than limiting.

Methods to correct non-flatness of a substrate of a mask and a mask are described herein. A substrate having a non-flat region on a surface is provided. At least a pair of correction layers is formed on the surface of the substrate over a non-flat region. A non-flat region of the pair of the correction layers is formed over the non-flat region of the substrate. The pair of the correction layers includes a layer of a first material and a layer of a second material. A thickness of the at least the pair of the correction layers formed on the substrate is determined by a height ("peak-to-valley distance") of the non-flat region of the substrate. Next, a portion of the correction layers over the non-flat region is heated locally. Heating removes the non-flat region from the correction layers by changing a thickness of the portion of the correction layers without physically removing any material. Changing the thickness of the portion of the correction layers is a result of converting at least partially the portion of the correction layers into a new material due to heating. The methods described herein provide a nondestructive correction of the non-flatness of the substrate of the mask with substantially high resolution and precision and can be easily incorporated into a volume mask manufacturing process without substantial modification of the equipment.

Figure 2:
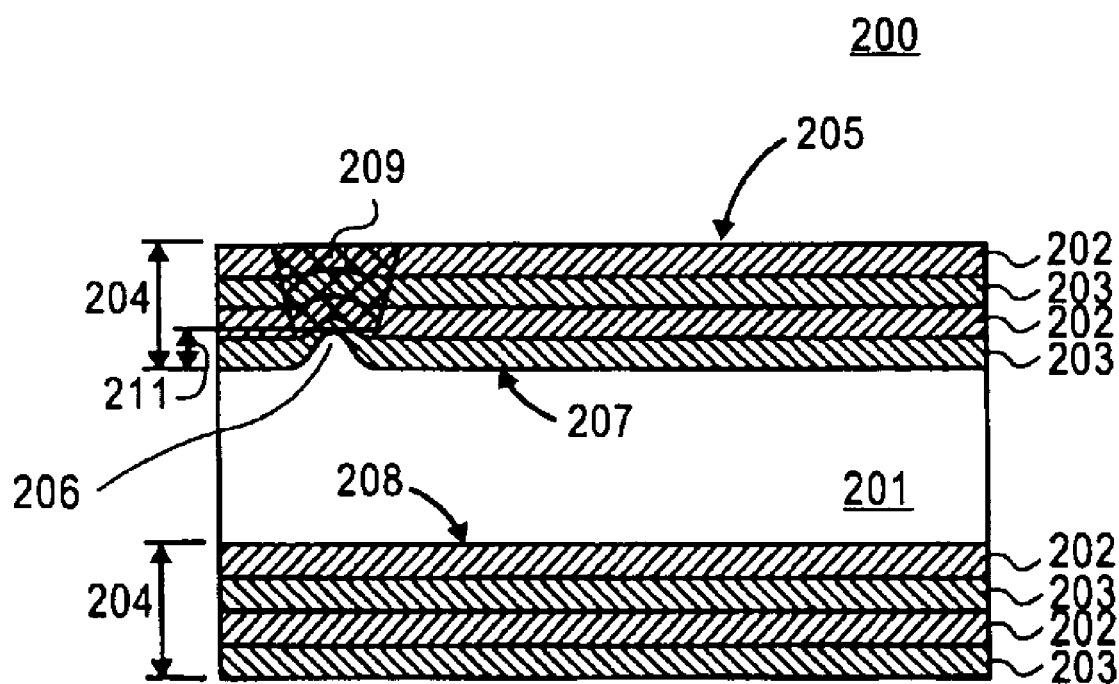
FIG. 2 is a cross-sectional view of a substrate of a mask having a non-flatness corrected according to one embodiment of the invention.

FIG. 2 is a cross-sectional view of a substrate 200 for a mask having a non-flatness corrected according to one embodiment of the invention. As shown in FIG. 2, a substrate 200 includes correction layers 204 formed on a front surface 207 and on a back surface 208 a substrate 201. For one embodiment, the substrate 201 having the non-flat region 206 is a low thermal expansion ("LTEM") substrate for a EUVL mask. A top surface 205 of the correction layers 204 is substantially flat, whereas the front surface 207 of the substrate 201 under the correction layers 204 has a non-flat region 206, which elevates a portion of a front surface 207 above the rest portion of the front surface 207, as shown in FIG. 2. For one embodiment, a height ("peak-to-valley distance") 211 of the non-flat region 206 of the substrate 201 is less than 100 nm. At least the pair of the correction layers 204 is formed on the back surface 208 of the substrate 201 to compensate for a stress induced by the correction layers 204 on the front surface 207 of the substrate 201. The correction layers 204 on the substrate 201 include a correction layer 202 of a first material and a correction layer 203 of a second material in alternating order, as shown in FIG. 2. As illustrated in FIG. 2, the correction layers 204 include a portion 209 of a new material converted due to heating from the first material and the second material of the correction layers 204, as described above.

Figure 3A:
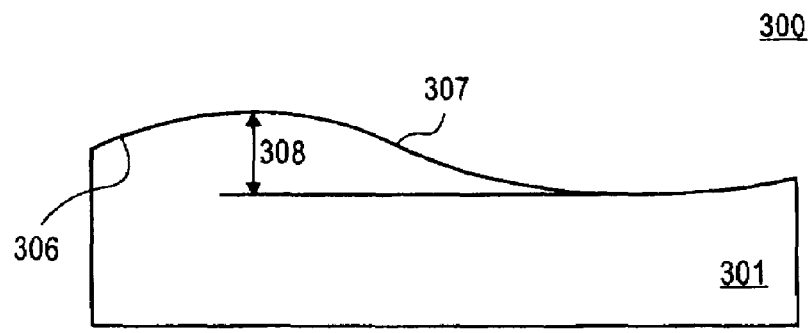
FIG. 3A is a cross-sectional view of a substrate to fabricate a mask according to one embodiment of the invention.

FIG. 3A is a cross-sectional view 300 of a substrate 301 to fabricate a mask according to one embodiment of the invention. As shown in FIG. 3A, a front surface 306 of the substrate 301 has a non-flat region 307 in a shape of a slope gradually extending from one part of the front surface 306 to the other part of the front surface 306 of the substrate 301. A difference between the highest point and the lowest point of the non-flat region 307 determines the peak-to-valley distance ("height") 308, shown in FIG. 3A, which defines the non-flatness of the surface. For one embodiment, the peak-to-valley distance 308 for the substrate 301 is less than 200 nm. For one embodiment, the substrate 301 for an EUVL mask is made of a low thermal expansion ("LTEM") material, for example, a titanium silicate glass. For one embodiment, the substrate 301 for the EUVL mask is an Ultra Low Expansion ("ULE®") glass substrate produced by Corning, Inc, located in Corning, N.Y. For one embodiment, the substrate 301 for a mask is made of glass, quartz, or any combinations thereof. For one embodiment, a diameter of the substrate 301 for the EUVL mask is about 6 inches. For one embodiment, the thickness of the substrate 301 for the EUVL mask is about 0.25 inches.

Figure 3B:
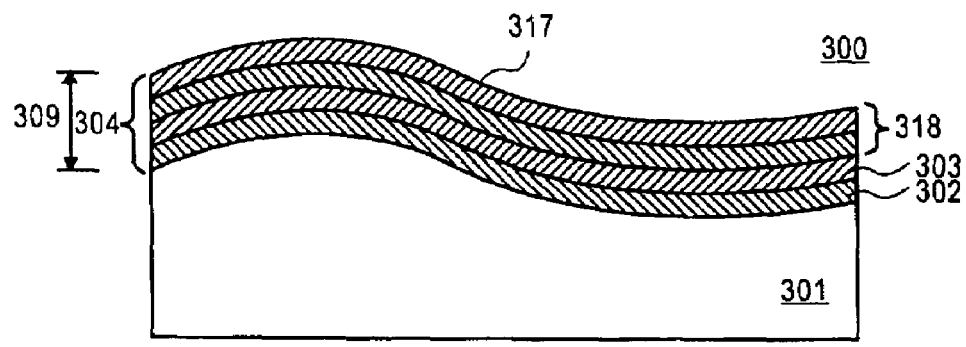
FIG. 3B is a view similar to FIG. 3A, after forming one or more pairs of correction layers on a front surface of the substrate over the non-flat region according to one embodiment of the invention.

FIG. 3B is the cross-sectional view 300 of the substrate 301 to fabricate the mask, wherein one or more pairs of correction layers 304 are formed on a front surface of the substrate 301 over the non-flat region 307 according to one embodiment of the invention. The correction layers 304 formed over the non-flat region 307 of the substrate 301 have a non-flat region 317, as shown in FIG. 3B. Each pair of correction layers 304 includes a layer 302 of a first material and a layer 303 of a second material formed in alternating order on the substrate 301, as shown in FIG. 3B. The first material and the second material of the correction layers 304 are such that they may be converted by heating later on in a process, at least partially, into a layer of a new material, which occupies a different amount of space ("volume") than the original correction layers 304, and has a different thickness than the original thickness of the correction layers 304 before heating. For one embodiment, before forming the correction layers 304 on the substrate 301, the surface of substrate 301 is polished using one of the techniques well known to one of ordinary skill in the art of mask fabrication, for example, using a mechanical polishing technique, chemical polishing technique, or a combination thereof.

For one embodiment, the layer 302 of the first material induces a stress onto the substrate 301 that has an opposite sign relative to the stress induced onto the substrate 301 by the layer 303 of the second material. For example, the layer 302 of the first material induces on the substrate 301 a compressive stress and the layer 303 of the second material induces on the substrate 301 a tensile stress, or vice versa. For one embodiment, the layer 302 on the substrate 301 is a silicon layer and the layer 303 is a metal layer. For another embodiment, the layer 303 is a silicon layer and the layer 302 on the substrate 301 is a metal layer. For example, the layer 302 is made of silicon ("Si"), and the layer 303 is made of molybdenum ("Mo"), nickel ("Ni"), titanium ("Ti"), cobalt ("Co"), or any combination thereof. For one embodiment, the ratio of thicknesses of the layer 302 to the layer 303 is such that the stress induced on the substrate 301 by the layer 302 is substantially compensated by the layer 303. The layer 302 and the layer 303 are thin enough to provide at least a partial conversion of the first material of the layer 302 and the second material of the layer 303 into a new material when heated later on in the process. For one embodiment, the thickness of each of the layer 302 and the layer 303 is at least about 1 nm. More specifically, the thickness of the layer of Si on the substrate 301 is in the approximate range of 1 nm to 200 nm, and the thickness of the layer of Mo is in the approximate range of 1 to 100 nm.

The thickness 309 of the correction layers 304 formed on the substrate 301 is determined by the peak-to-value distance 308 of the non-flat region 307 to be corrected later on in the process. For one embodiment, the thickness 309 of the correction layers 304 is determined by an interferrogram mapping of the surface of the substrate 301. For one embodiment, the thickness 309 of the correction layers 304 is in the approximate range of 4 nm to 1 microns ("μm"). For one embodiment, the thickness 309 of the correction layers 304, which include the layer of Mo and the layer of Si formed in alternating order on the substrate 301 of the LTEM material over the non-flat region 307 with the peak-to-valley distance 308 in the approximate range of 10 nm to 100 nm, is between 50 nm and 800 nm. More specifically, for the peak-to-valley distance 308 in the approximate range of 50-70 nm, the thickness 309 of the correction layers 304 is in the approximate range of 260 nm-300 nm. For an embodiment, the layer 302 and the layer 303 may be deposited on the substrate 301 using one of the techniques, which are well known to one of ordinary skill in the art of mask fabrication, for example, using an ion beam sputtering, physical vapor deposition ("PVD"), or a direct current ("DC") magnetron sputtering.

Figure 3C:
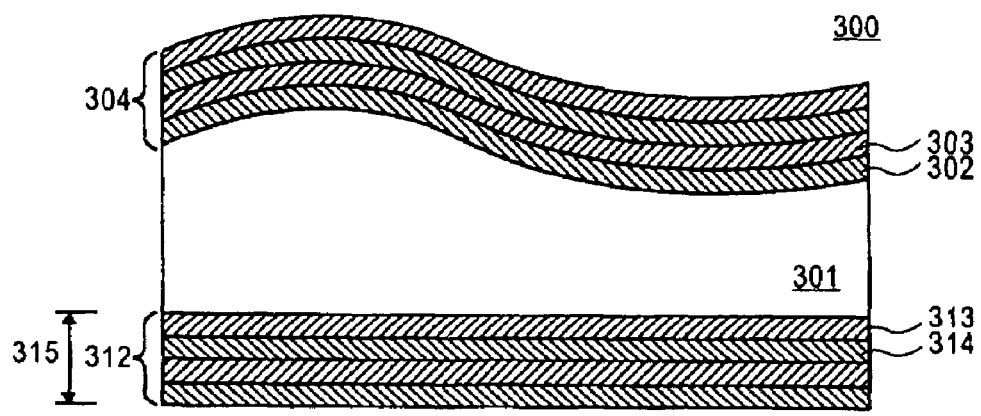
FIG. 3C is a view similar to FIG. 3B, after one or more pairs of correction layers are formed on a back surface of the substrate according to another embodiment of the invention.

FIG. 3C is the cross-sectional view 300 of the substrate 301, wherein one or more pairs of correction layers 312 are formed on a back surface of the substrate 301 according to another embodiment of the invention. The correction layers 312 are formed on the back surface of the substrate 301 to balance ("compensate") for a residual stress induced by the correction layers 304 on the front side of the substrate 301. For an embodiment, the pair of correction layers 312 includes a layer 313 of a first material and a layer 314 of a second material formed in alternating order on the back side of the substrate 301, as shown in FIG. 3C. For one embodiment, the layer 313 of the first material induces a stress onto the substrate 301 that has an opposite sign relative to the stress induced onto the substrate 301 by the layer 314 of the second material. For example, the layer 313 of the first material induces on the substrate 301 a compressive stress and the layer 314 of the second material induces on the substrate 301 a tensile stress, or vice versa. For one embodiment, the layer 313 on the substrate 301 is a silicon layer and the layer 314 is a metal layer. For another embodiment, the layer 313 on the substrate 301 is a silicon layer and the layer 314 is a metal layer. For example, the first layer 313 is made of Mo, and the layer 314 is made of Si, or vice versa. For one embodiment, the ratio of thicknesses of the layer 313 to the layer 314 is such that the stress induced on the substrate 301 by the layer 313 is substantially compensated by the layer 314. For one embodiment, the thickness of each of the layer 313 and the layer 314 is at least about 1 nm. More specifically, the thickness of the layer of Si on the back surface of the substrate 301 is in the approximate range of 3 nm to 6 nm, and the thickness of the layer of Mo on the back surface substrate 301 is in the approximate range of 1 to 4 nm.

The thickness 315 of the correction layers 312 including one or more pairs of the layer 313 and the layer 314 is defined by the amount of residual stress induced on the substrate 301 by the correction layers 304, which is to balance ("compensate"). For an embodiment, the thickness 315 of the correction layers 312 is defined by the thickness 309 of the correction layers 304 on the substrate 301. For example, when the thickness 309 of the correction layers 304, which include alternating layers of Mo and Si, formed on the front surface of substrate 301 made of LTEM material, is in the approximate range of 4 nm to 400 nm, the thickness 315 of the correction layers 312, which include alternating layers of Mo and Si, formed on the back side of the substrate 301 is also in the approximate range of 4 nm to 400 nm. For an embodiment, the layer 313 and the layer 314 may be deposited on the back surface of the substrate 301 using one of the techniques, which are well known to one of ordinary skill in the art of mask fabrication, for example, using an IBD, an PVD, or a DC magnetron sputtering.

Figure 3D:
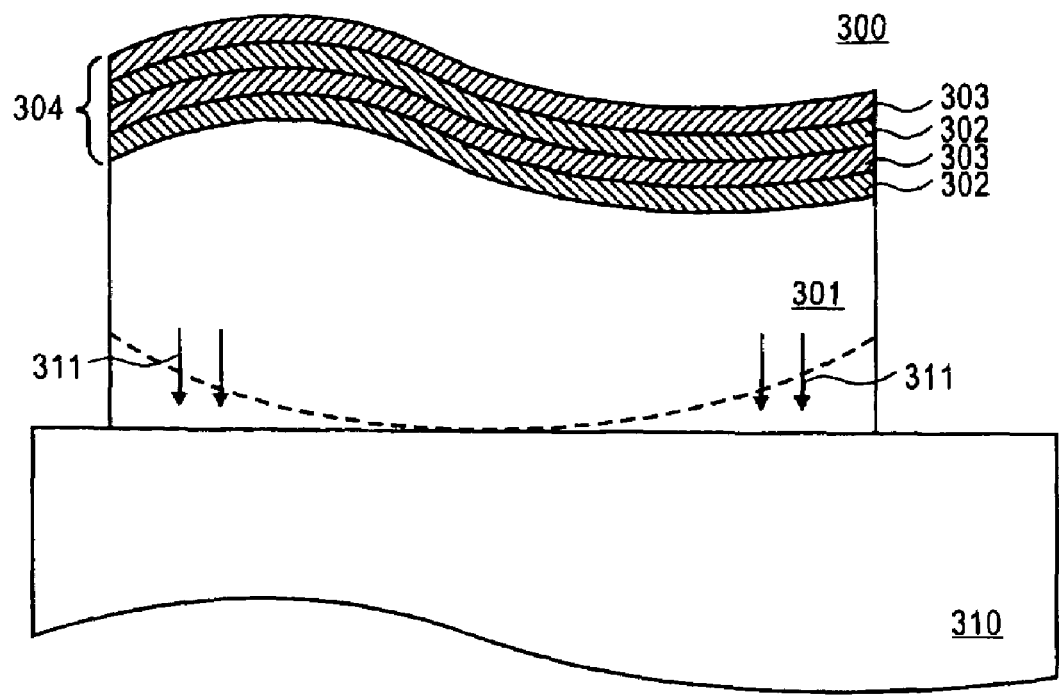
FIG. 3D is a view similar to FIG. 3B, wherein the substrate is placed on a chuck to compensate for a stress generated by the correction layers on the front surface of the substrate according to another embodiment of the invention.

For another embodiment, the residual stress induced on the substrate 301 by the correction layers 304 is compensated by using a chuck 310, as shown in FIG. 3D. FIG. 3D is the cross-sectional view 300, wherein the substrate 301 having the correction layers 304 is placed on a plate of the chuck 310. The chuck 310 uses a force 311 to clamp down the back surface of the substrate 301 to a plate of the chuck 310 that removes bending of the substrate 301, as shown in FIG. 3D. For an embodiment, the chuck 310 is an electrostatic chuck, which uses an electrostatic force generated by electrodes of the chuck to clamp the substrate 301. For another embodiment, the chuck is a mechanical chuck, which uses a mechanical force to clamp the substrate 301 to the plate of the chuck 310. For yet another embodiment, the chuck may use a combination of electrical and mechanical forces to clamp the substrate 301 to the plate of the chuck 310. Such chucks are well known to one of ordinary skill in the art of mask fabrication.

Figure 3E:
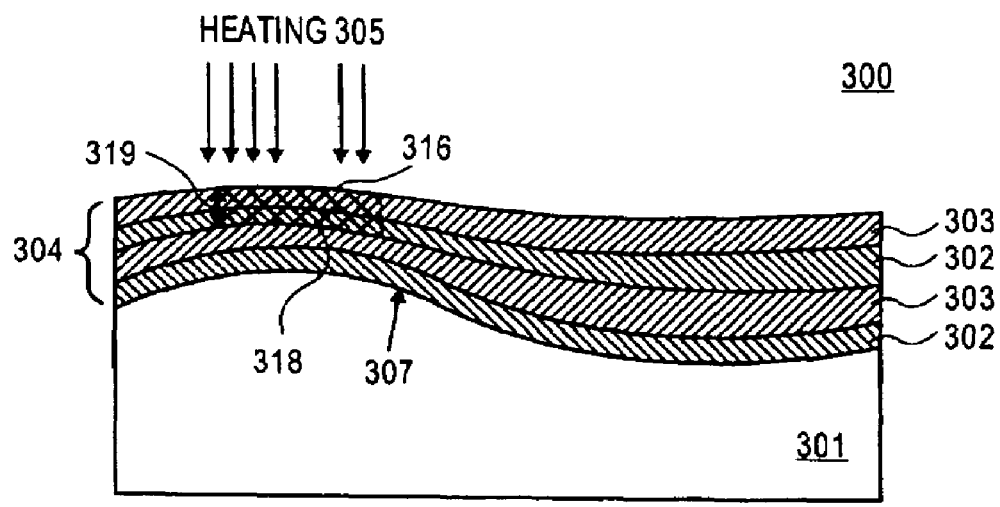
FIG. 3E is a view similar to FIG. 3B, wherein a portion of the correction layers is heated to provide a non-flatness correction of the substrate for the mask according to one embodiment of the invention.

FIG. 3E is a cross-sectional view 300 of the substrate 301 for the mask, wherein heating 305 is performed over a portion 316 of the correction layers 304 on the substrate 301 for a predetermined time and at a predetermined temperature to provide non-flatness correction of the substrate for the mask according to one embodiment of the invention. As shown in FIG. 3E, the portion 316 of the correction layers 304 is converted at least partially into a layer 318 of a new material by heating 305 without physically removing any material of the correction layers 304 and the substrate 301. The quantity of the correction layers 304 of the portion 316 converted to the layer 308 of the new material depends on the heating time and the heating temperature. The temperature to heat the portion 316 of the correction layers 304 is defined by the conversion efficiency of the first material of the layer 302 and the second material of the layer 303 into the layer 318 of the new material. Generally, higher the heating temperature, shorter heating time is needed to provide the same non-flatness correction. The temperature and the time for heating are optimized to provide control over the conversion of the layer 302 of the first material and the layer 303 of the second material into the layer 318 of the new material. Lower heating temperature provides better control over the height reduction of the non-flat region of the correction layers 304. For one embodiment, the heating time and the heating temperature are selected from the look-up table created from the experimental data on a height of the non-flatness region as a function of heating time at various heating temperatures. Heating 305 provides chemical bonding between molecules of the first material and the second material of the correction layers 304 producing a layer 318 of a new material, which is a chemical compound of the first material and the second material. The thickness 319 of the layer 318 of the new material is changed relative to the thickness of the correction layers 304 before heating, as shown in FIG. 3E. For one embodiment, the portion 316 of the correction layers 304, which include alternating layers of a metal and Si, is converted by heating, at least partially, into the layer 318 of a metal silicide having the thickness 319 smaller than the original thickness of the correction layers 304. More specifically, the layer 318 of the new material generated as a result of heating of the alternating layers of molybdenum and silicon, is the layer of molybdenum silicide.

For an embodiment, as shown in FIG. 3E, heating 305 may have a gradient of temperature along the portion 316 of the correction layers 304. The gradient of temperature generates the layer 318 of the new material, wherein the thickness 319 varies along the portion 316 to compensate for the slope of the non-flat region of the correction layers 304. For one embodiment, the amount of non-flatness correction, the thickness 319 of the layer 318 of the new material, the location of the heating, heating power and the heating time may be programmed according to the interferrogram map of the surface of the substrate 301. For one embodiment, the temperature for heating the portion 316 of the correction layers 304, is at least 200° C. and the time for heating is at least 1 second. For one embodiment, the temperature for heating the portion 316 of the correction layers 304 including alternating layers of a metal and Si, is in the approximate range of 200° C. to 600° C. and the time is in the approximate range of 1 second to 180 minutes. More specifically, the temperature for heating the correction layers 304 including alternating layers of Mo and Si is in the approximate range of 300° C. to 400° C. and the time is in the approximate range of 1 minute to 30 minutes. For one embodiment, the heating of the portion 316 of the correction layers 304 is performed using an electron beam, a laser beam, an ion beam, or any combination thereof.

Heating parameters are selected to leave the materials of the correction layers 304 and the substrate 301 physically intact during heating. For example, for heating 305 with the electron beam, the voltage of the electron beam is adjusted to avoid the physical damage of the correction layers 304 and the substrate 301. For heating 305 using the laser beam, the wavelength of the laser radiation is selected such that does not damage the correction layers 304 and the substrate 301, for example, the radiation in the infrared wavelength range. For heating 305 using the ion beam, sputtering, ion implantation, and hitting with the ions the correction layers 304 and the substrate 301 are avoided. For an embodiment, the beam for heating may be a continuous beam, a pulsed beam, or any combination thereof. The size of the beam to perform heating 305 depends on a spatial frequency of the non-flat regions on the surface of the substrate 301. Higher the spatial frequency of the non-flat regions on the surface of the substrate, smaller the diameter of the beam to perform heating is used to provide spatial resolution. For one embodiment, a diameter of the beam to heat the portion 316 of the correction layers 304 on the substrate 301 is in the approximate range of 5 nm to several microns.

For one embodiment, heating 305 may be performed after the correction layers 312 are formed on the back surface of the substrate 301 to compensate for the stress induced by the correction layers 304, as described with the reference to FIG. 3C. For another embodiment, heating 305 may be performed after the substrate 301 having correction layers 304 is placed on the chuck 310, as described with the reference to FIG. 3D. For one embodiment, the correction of the non-flatness of the back surface of the substrate 301 may be performed using a process described above in FIGS. 3A-3E with respect to the front surface of the substrate 301.

Figure 3F:
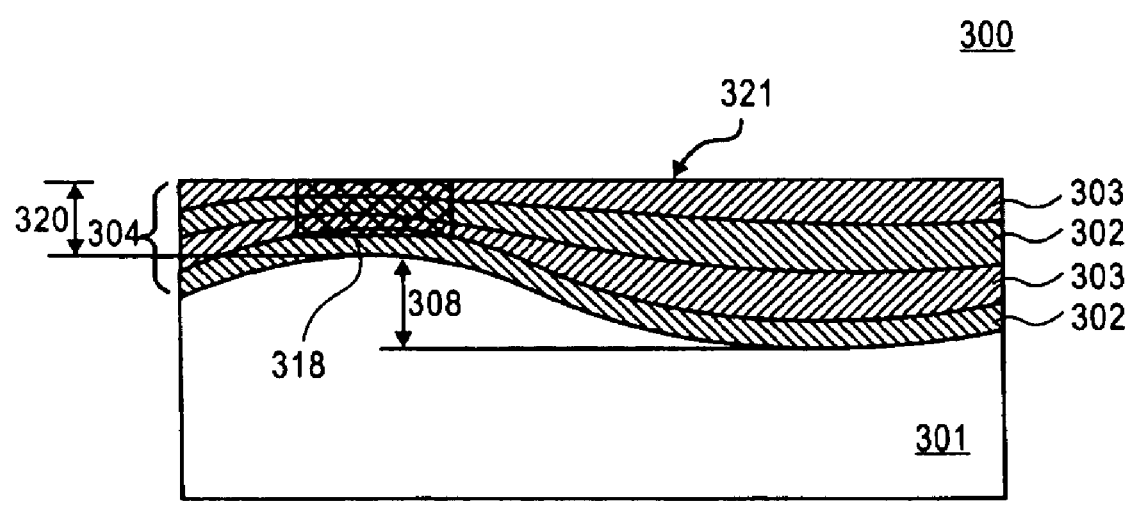
FIG. 3F is a view similar to FIG. 3E, after heating of the portion of the correction layers according to one embodiment of the invention.

FIG. 3F is a cross-sectional view 300 of the substrate 301 for the mask after heating is performed according to one embodiment of the invention. As shown in FIG. 3F, the non-flat region 317 of the correction layers 304 shown in FIG. 3B is removed after heating resulting in a substantially flat surface of the correction layers 304. For one embodiment, the peak-to-valley distance of the correction layers 304 after heating is less than the detection level of the surface non-flatness measuring equipment. The surface non-flatness measuring equipment may be an atomic force microscope, an interferometer, and any other surface measuring equipment known to one of ordinary skill in the art of mask fabrication. More specifically, the peak-to-valley distance of the top surface 321 of the correction layers 304 after heating may be less than 30 nm. The correction layers 304 include the layer 302 of the first material, the layer 303 of the second material, and the layer 318 of the new material, as shown in FIG. 3F. The thickness 320 of the correction layers 304 including the layer 318 of the new material is smaller than the original thickness of the correction layers 304 before heating to compensate for the peak-to-valley distance 308 of the non-flat region 307 of the substrate 301.

Figure 4A:
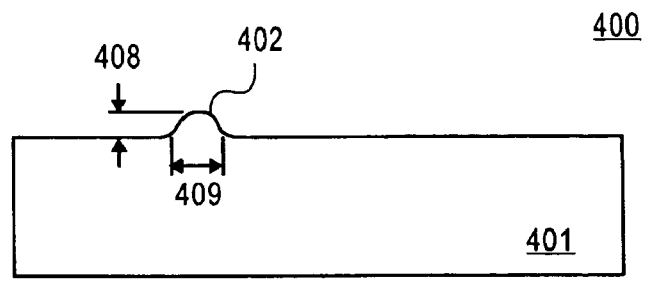
FIG. 4A is a cross-sectional view of a substrate to fabricate a mask according to another embodiment of the invention.

FIG. 4A is a cross-sectional view 400 of a substrate 401 to fabricate a mask according to another embodiment of the invention. As shown in FIG. 4A, a front surface of the substrate 401 has at least one local non-flat region in a shape of a bump defect 402, which elevates a portion of a front surface of the substrate 401 above the other portions of the front surface of the substrate 401. As shown in FIG. 4A, the bump defect 402 has a peak-to-valley distance ("height") 408 and a size 409. For one embodiment, each of the height 408 and the size 409 of the bump defect 402 is less than 100 nm. The substrate 401 of the mask may be any of the substrates described above with respect to FIG. 3A. For one embodiment, the bump defect 402 may be any isolated feature on the surface of the substrate 401, for example, a particle, a point defect, a surface feature created as a result of substrate inhomogeneity during polishing of the substrate 401, or a combination thereof.

Figure 4B:
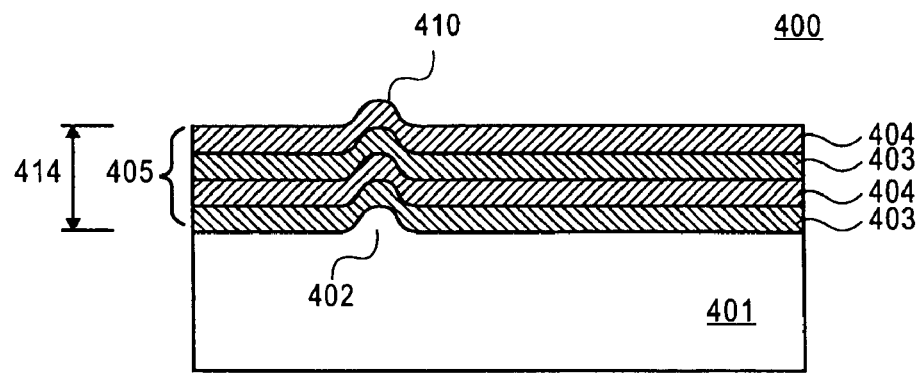
FIG. 4B is a view similar to FIG. 4A, after forming correction layers on the substrate over a local non-flat region.

FIG. 4B is a cross-sectional view 400 of the substrate 401 for the mask, wherein one or more pairs of correction layers 405 are formed on a front surface of the substrate 401 over the bump defect 402 using a process and materials described above with respect to FIG. 3B. As shown in FIG. 4B, the correction layers 405 include a bump defect 410 over the bump defect 402 of the substrate 401. The correction layers 405 have alternating layers of the first material 403 and the second material 404 as described above with respect to FIG. 3B. The thickness 414 of the correction layers 405 deposited on the substrate 401 is determined by the height 408 of the bump defect 402 of the substrate 401. For one embodiment, the peak-to-valley distance of the bump defect 410 of the correction layers 405 deposited on the substrate 401 is less than 100 nm. For an embodiment, to compensate for a stress induced by the correction layers 405 on the front surface of the substrate 401, the correction layers on the back surface of the substrate 401 may be formed using a process described above with respect to FIG. 3C. For another embodiment, to compensate for a stress induced by the correction layers 405 on the substrate 401, the chuck described with respect to FIG. 3D, may be used.

Figure 4C:
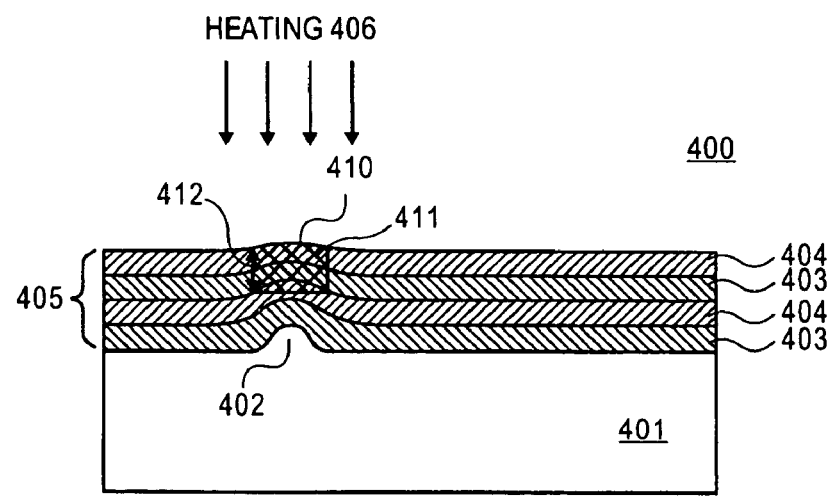
FIG. 4C is a view similar to FIG. 4B, wherein a portion of the correction layers on the substrate is heated locally.

Next, as shown in FIG. 4C, heating 406 of the portion of the correction layers 405 is performed locally over the bump defect 410 for a predetermined time and at a predetermined temperature using a process described above with respect to FIG. 3E. The heating 406, as shown in FIG. 4C, reduces the height of the bump defect 410 of the correction layers 405 by converting at least partially, a portion of the correction layers 405 into the layer 411 of the new material leaving all materials physically intact, as described above with respect to FIG. 3B. As shown in FIG. 4C, the thickness 412 of the layer 411 of the new material is smaller than the thickness of the original portions of the correction layers 405 that reduces the bump defect 410 on the top surface of the correction layers 405. The reduction of the height of the bump defect 410 may be controlled by a time dependence of a fraction of the correction layers 405 converted by heating into the new material. For example, for alternating layers of a metal and Si, the reduction of the height of the bump defect 410 may be controlled by a time dependence of a fraction of the correction layers 405 silicidation during heating. Heating 406 is performed locally using a beam, for example, an e-beam, a laser beam, an ion beam, or any combination thereof, as described above with respect to FIG. 3E. Further, the heating 406 is moved over a next bump defect (not shown) of the correction layers 405, which is formed over the next bump defect (not shown) of the substrate 401. Next, heating 406 over the next bump defect (not shown) of the correction layers 405 is performed using a process described above with respect to the bump defect 410. The process of moving of the beam and heating 406 of the next bump defect of the correction layers 405 is repeated until all bump defects of the surface of the substrate are removed. For an embodiment, the moving of the beam and the heating 406 of the next bump defect of the correction layers 405 may be controlled automatically using, as a feedback, a surface non-flatness map of the substrate 401 obtained by one of the surface measuring techniques known to one of ordinary skill in the art of mask fabrication, as described above with respect to FIG. 3E. For an embodiment, the diameter of the beam and a moving step of the beam to perform heating 406 is determined by a spatial frequency of the bump defects on the surface of the substrate 401 and the size of the bump defects. Typically, higher the spatial frequency of the bump defects and smaller the size of the bump defects, smaller the diameter of the beam is used to provide spatial resolution and perform heating over each bump defect for predetermined time and at a predetermined temperature according to the height of each of the bump defects. For one embodiment, a diameter of the beam to heat the portion 410 of the correction layers 405 on the substrate 401 is in the approximate range of 5 nm to 100 nm.

Figure 4D:
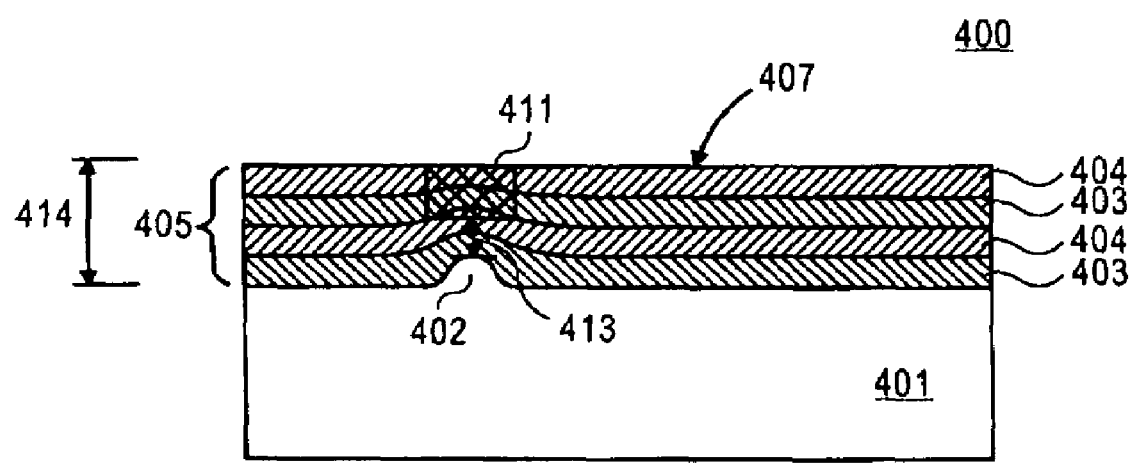
FIG. 4D is a view similar to FIG. 4C, after heating locally the portion of the correction layers on the substrate.

FIG. 4D is a cross-sectional view 400 of the substrate 401 for the mask after heating 406 according to one embodiment of the invention. As shown in FIG. 4D, the bump defect 410 of the correction layers 405 is removed after heating resulting in a substantially flat surface of the correction layers 405. For one embodiment, after heating 406, the peak-to-valley distance of the top surface 407 of the correction layers 405 is not more than the detection limit of the surface non-flatness measuring equipment. More specifically, the peak-to-valley distance of the top surface 407 of the correction layers 405 after heating is less than 30 nm. The correction layers 405 include the layer 403 of the first material, the layer 404 of the second material, and the layer 411 of the new material, as shown in FIG. 4D. The thickness 413 of the correction layers 405 including the layer 411 of the new material above the bump defect 402 is smaller than the thickness 414 of the unheated portions of the correction layers 405. The difference between the thickness 413 and the thickness 414 compensates for the height of the bump defect 410 of the correction layers 405 over the bump defect 402 of the substrate 401.

For one embodiment, the correction layers may be deposited on the substrate to smooth the substantially small defects on the surface of the substrate without subsequent heating. For example, the correction layers having the thickness more than 120 nm deposited over the bump defect having the height less than 30 nm using, for example, a near-normal incidence ion beam sputtering technique, may smooth the surface of the substrate.

Figure 5A:
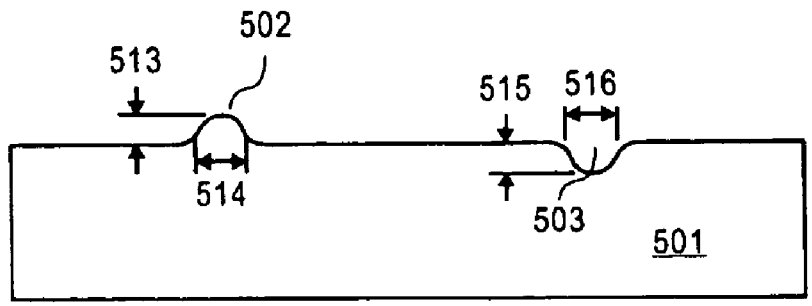
FIG. 5A is a cross-sectional view of a substrate to fabricate a mask according to another embodiment of the invention.

FIG. 5A is a cross-sectional view 500 of a substrate 501 to fabricate a mask according to another embodiment of the invention. As shown in FIG. 5A, a front surface of the substrate 501 has a bump defect 502 and a depression defect 503. The bump defect 502 has a peak-to-valley distance ("height") 513 and a size 514, the depression defect 503 has a peak-to-valley distance ("depth") 515 and a size 516. For one embodiment, each of the height 513 and the size 514 of the bump defect 502 and each of the depth 515 and the size 516 of the depression defect 503 is less than 100 nm. The substrate 501 of the mask may be any of the substrates described above with respect to FIG. 3A. For one embodiment, the bump defect 502 and the depression defect 503 may be any isolated feature on the surface of the substrate 401, for example a surface feature created during polishing of the substrate 401 earlier in a process as a result of substrate inhomogeneity. For example, the bump defect 502 may be a particle, and the depression defect 502 may be a pit on the surface of the substrate 501.

Figure 5B:
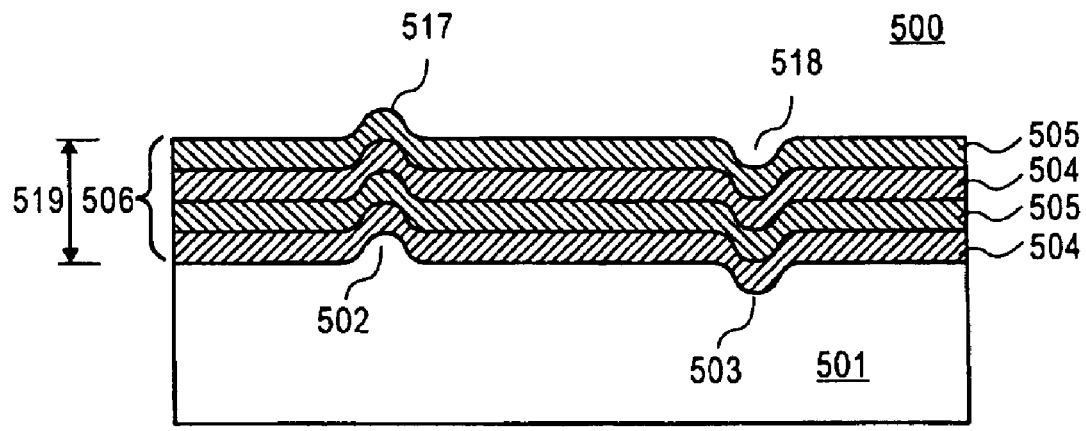
FIG. 5B is a view similar to FIG. 5A, after correction layers are formed to correct a bump defect on the substrate.

FIG. 5B is a cross-sectional view 500 of the substrate 501 for the mask, after one or more pairs of correction layers 506 are formed on a front surface of the substrate 501 over the bump defect 502 and the depression defect 503 using a process and materials described above with respect to FIGS. 3B and 4B. As shown in FIG. 5B, the correction layers 506 include a bump defect 517 propagated over the original bump defect 502 of the substrate 501 and a propagated depression defect 518 over the original depression defect 503 of the substrate 501. The correction layers 506 have alternating layers of the material 504 and the material 505 as described above with respect to FIG. 3B. The thickness 519 of the correction layers 506 deposited on the substrate 501 is determined by the height 513 of the bump defect 502 of the substrate 501.

Figure 5C:
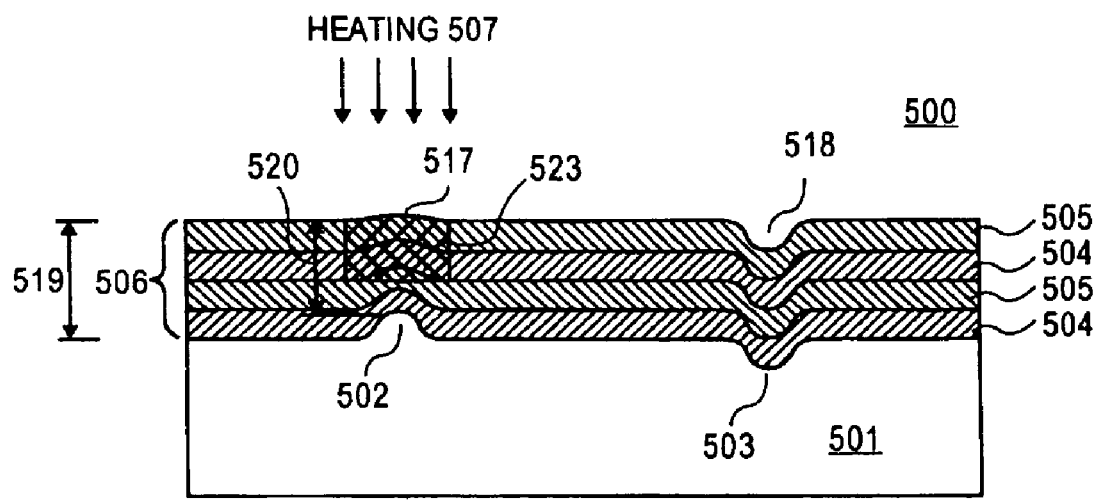
FIG. 5C is a view similar to FIG. 5B, wherein a portion of the correction layers on the substrate over the bump defect is heated locally.

Next, as shown in FIG. 5C, heating 507 of the portion of the correction layers 506 is performed locally over the bump defect 517 for a predetermined time and at a predetermined temperature using a process described above with respect to FIG. 3E. The local heating 507, as shown in FIG. 5C, removes the bump defect 517 of the correction layers 506 by converting at least partially, a portion of the correction layers 506 having the material 504 and the material 505 into the layer of a new material 523 leaving all materials physically intact, as described above with respect to FIG. 3B. As shown in FIG. 5C, the thickness 520 of the correction layers 506 including the layer of the new material 523 is smaller than the original thickness 519 of the correction layers 506 before heating that reduces the bump defect 517 on the top surface of the correction layers 506. Heating 507 is performed locally using a beam, for example, an e-beam, a laser beam, an ion beam, or any combination thereof, as described above with respect to FIGS. 3E and 4C.

Figure 5D:
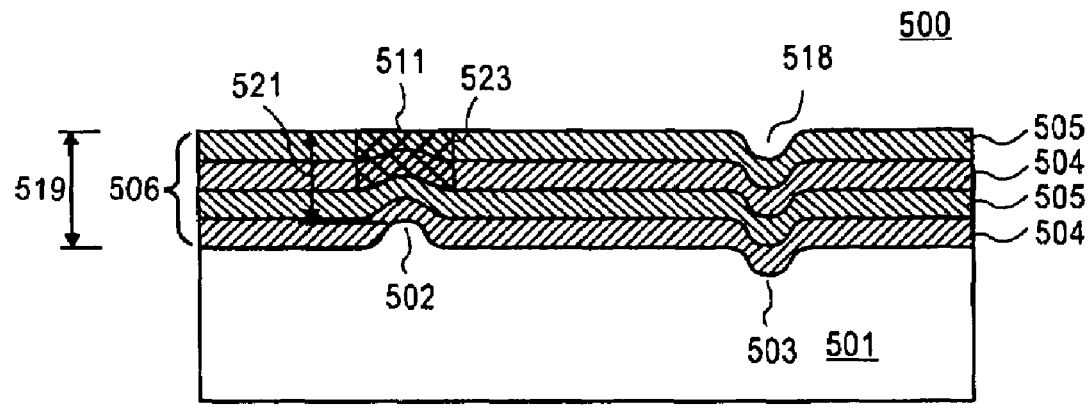
FIG. 5D is a view similar to FIG. 5C, after heating locally the portion of the correction layers on the substrate over the bump defect.

FIG. 5D is a cross-sectional view 500 of the substrate 501 for the mask after heating 507 according to one embodiment of the invention. As shown in FIG. 5D, the bump defect 517 of the correction layers 506 is removed after heating resulting in a substantially flat portion 511 of the top surface of the correction layers 506 over the bump defect of the substrate 501. For one embodiment, after heating 507, the peak-to-valley distance of the portion 511 of the top surface of the correction layers 506 is not more than the detection limit of the surface non-flatness measuring equipment. More specifically, the peak-to-valley distance of the portion 511 of the top surface of the correction layers 506 after heating 507 is less than 30 nm. The correction layers 506 include the layer of the material 504, the layer of the material 505, and the layer of the new material 523, as shown in FIG. 5D. The thickness 521 of the correction layers 506 including the layer of the new material 523 above the bump defect 502 is smaller than the thickness 519 of the unheated portions of the correction layers 506, which include the material 504 and the material 505. The difference between the thickness 521 and the thickness 519 of the correction layers 506 compensates for the height of the bump defect 517 of the correction layers 506 over the bump defect 502 of the substrate 501.

Figure 5E:
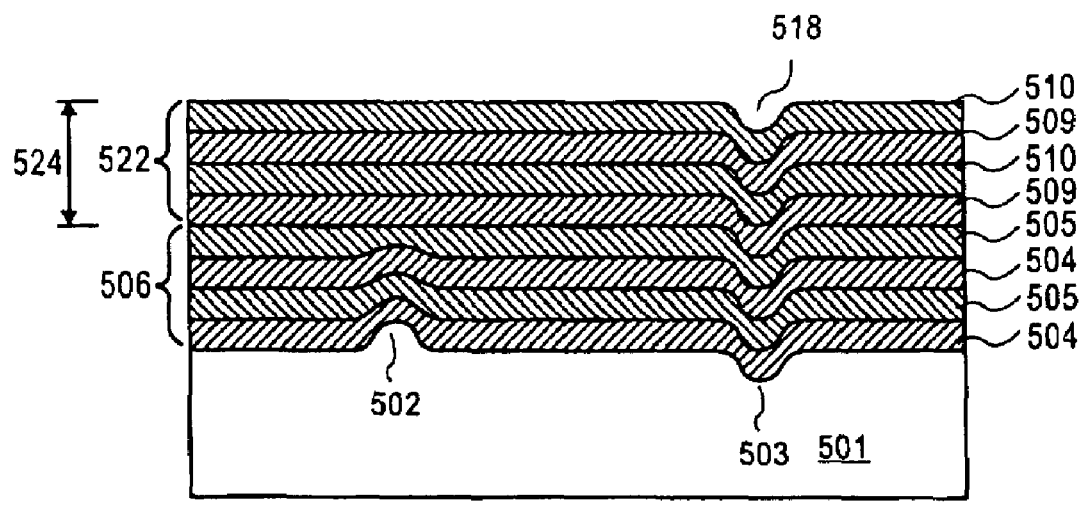
FIG. 5E is a view similar to FIG. 5D, after another correction layers are formed to correct a depression defect on the substrate.

FIG. 5E is a cross-sectional view 500 of the substrate 501 for the mask, after one or more pairs of another correction layers 522 are formed on the correction layers 506 to correct the depression defect 503 using a process described above with respect to FIGS. 3B, 4B and 5B. As shown in FIG. 5E, the another correction layers 522 are formed on the portion 511 of the top surface of the correction layers 506, wherein the bump defect 517 is removed by heating 507 as described above with respect to FIG. 5C. The another correction layers 522 include a propagated depression defect 518 over the original depression defect 503 of the substrate 501. The another correction layers 522 have alternating layers of material 509 and material 510, as shown in FIG. 5E. The material 509 and the material 510 convert by heating at least partially into a new material, which occupies a volume larger than the original volume of the another correction layers 522, and has a larger thickness than the original thickness of the another correction layers 522 before heating. For an embodiment, the material 509 may be a metal and the material 510 may be a non-metal. The thickness 524 of the another correction layers 522 deposited on the correction layers 506 is determined by the peak-to-valley distance of the depression defect 503 of the substrate 501.

Figure 5F:
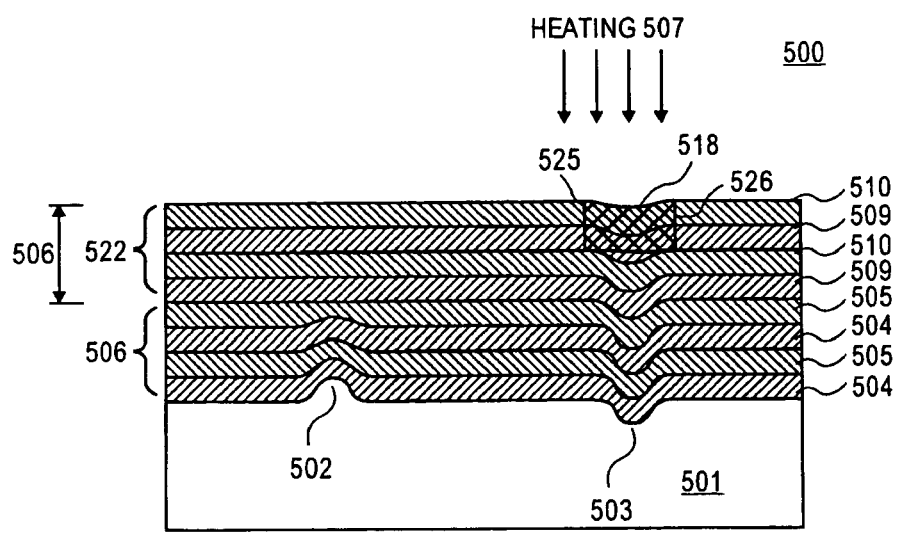
FIG. 5F is a view similar to FIG. 5E, wherein a portion of the another correction layers over the depression defect is heated locally.
Figure 5G:
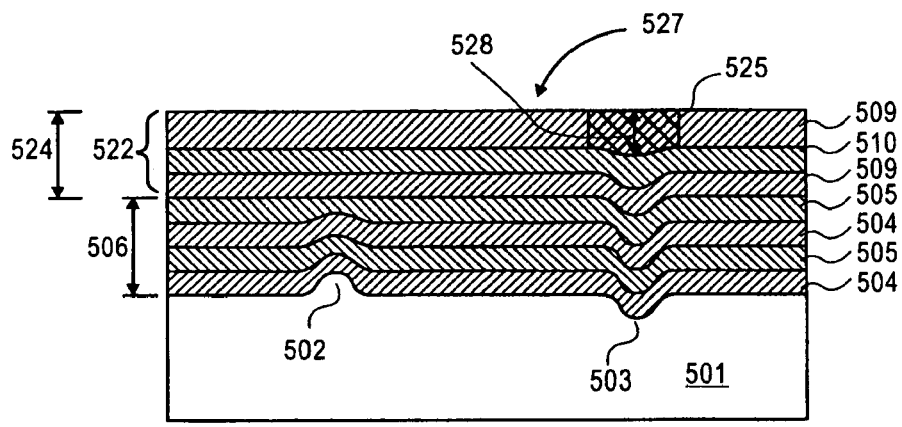
FIG. 5G is a view similar to FIG. 5F, after heating locally a portion of the another correction layers over the depression defect and removing an unheated portion of a top layer of metal of the another correction layers according to one embodiment of the invention.

Next, as shown in FIG. 5F, heating 507 of the portion of the correction layers 506 is performed locally over the depression defect 518 for a predetermined time and at a predetermined temperature using a process described above with respect to FIG. 3E. The local heating 507, as shown in FIG. 5F, removes the depression defect 518 by converting at least partially, a portion of the another correction layers 522 having the material 509 and the material 510 into a layer of a new material 525 without physically removing any materials, as described above with respect to FIG. 5C. As shown in FIG. 5F, the thickness 526 of the layer of the new material 525 is larger than the pre-heated original thickness 524 of the another correction layers 522. The height of the depression defect 518 on the top surface of the another correction layers 522 is reduced. Heating 507 is performed locally using a beam, for example, an e-beam, a laser beam, an ion beam, or any combination thereof, as described above with respect to FIGS. 3E and 4C. For one embodiment, as shown in FIG. 5G, after heating 507, to remove the depression defect 518, an unheated portion of a top layer of the material 510, for example, Pd, Pt, Ti, Ta, Co, or Ni, may be removed from the layer of the material 509, for example, silicon. The unheated portion of the top layer of the material 510 may be removed from the layer of the material 509 for example, by etching.

Figure 5H:
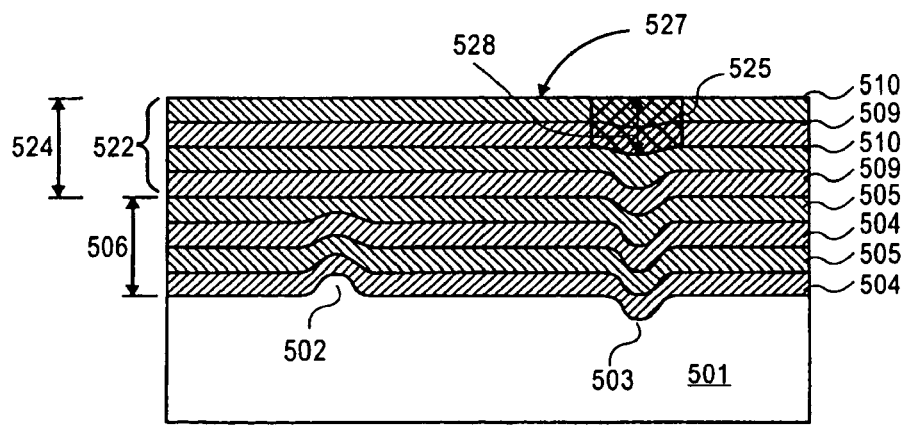
FIG. 5H is a view similar to FIG. 5F, after heating locally the portion of the another correction layers over the depression defect according to another embodiment of the invention.

FIG. 5H is a cross-sectional view 500 of the substrate 501 for the mask, after heating 507 is performed over the depression defect 518 according to another embodiment of the invention. As shown in FIG. 5H, after heating the depression defect 518 of the another correction layers 522 may be removed resulting in a substantially flat top surface 527 of the another correction layers 522 over the depression defect 503 and over the bump defect 502 of the substrate 501. For one embodiment, after heating, the peak-to-valley distance of the substantially flat top surface 527 is not more than the detection limit of the surface non-flatness measuring equipment. More specifically, after heating the peak-to-valley distance of the top surface 527 may be less than 30 nm. After heating, the another correction layers 522 include the layer of the material 509, the layer of the material 510, and the layer of the new material 525, as shown in FIG. 5H.

For an embodiment, to compensate for a stress induced by the correction layers 506 and the another correction layers 522 on the front surface of the substrate 501, the correction layers on the back surface of the substrate 501 may be formed using a process described above with respect to FIG. 3C. For another embodiment, to compensate for a stress induced by the correction layers 506 and the another correction layers 522 on the substrate 401, the chuck, as described with respect to FIG. 3D, may be used.

Figure 6A:
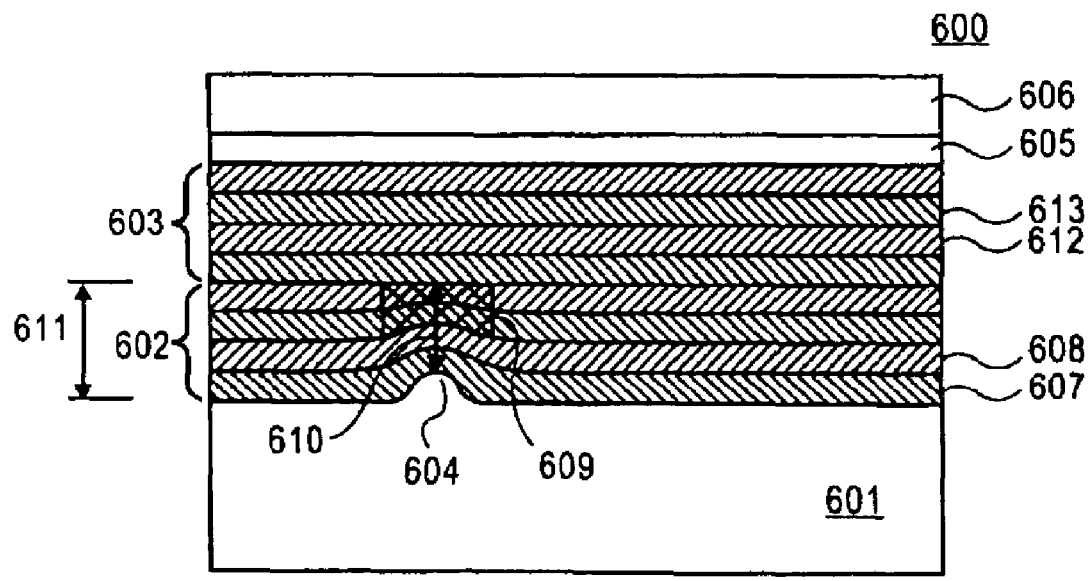
FIG. 6A is a cross-sectional view of a EUVL mask blank having a non-flatness of the substrate corrected, according to one embodiment of the invention.

FIG. 6A is a cross-sectional view of a EUVL mask blank 600 having a non-flatness of the substrate 601 corrected using a process and materials described above with respect to FIGS.

3-5 according to one embodiment of the invention. As shown in FIG. 6A, one or more of the correction layers 602 are formed over a non-flat region in a shape of a bump defect 604 on the substrate 601. The correction layers 602 include the layer of the material 607, the layer of the material 608 in an alternating order, and a layer of the new material 609, as shown in FIG. 6A. The thickness 610 of the correction layers 602 including the layer of the new material 609 above the bump defect 604 is smaller than the thickness 611 of the unheated portions of the correction layers 602, as described above with respect to FIGS. 3-5. The difference between the thickness 611 of unheated portions of the correction layers 602 and the thickness 610 of a heated portion of the correction layers 602 removes the difference in a height between the portion of the top surface over the bump defect 604 and the rest of the top surface of the correction layers 602, as described above with respect to FIGS. 3-5.

Next, a multilayer mirror 603 is formed on the correction layers 602, as shown in FIG. 6A. The multilayer mirror 603 has 20-80 pairs of alternating layers of two materials, wherein a difference of indexes of refraction between the two materials is substantially large to provide substantially high reflection of the EUVL light. For an embodiment, the multilayer mirror 603 may include a high index of refraction material 612, for example, Mo and a low index of refraction material 613, for example, Si. The thickness of each pair of alternating layers of the multilayer mirror 603 satisfies the modified Bragg's law for a distributed Bragg reflector. For one embodiment, the multilayer mirror 603 has the layer of Mo having the thickness in the approximate range of 2 nm to 4 nm, and the layer of Si having the thickness in the approximate range of 3 nm to 5 nm. More specifically, the layer of Mo is about 2.8 nm thick and the layer of Si is about 4.2 nm thick. The multilayer mirror 603 may be formed on the correction layers 602 using one of techniques well known to one of ordinary skill in the art of EUVL mask fabrication, for example using ion beam deposition, PVD, DC magnetron sputtering, or any combination thereof.

For one embodiment, as shown in FIG. 6A, a capping layer 605 is formed on the multilayer mirror 603 to protect the multilayer mirror 603 from chemical and mechanical processing of the mask blank 600 later on in the process. For an embodiment, the thickness of the capping layer 605 is in the approximate range of 4 nm to 11 nm. The material for the capping layer 605 may be ruthenium ("Ru"), Si, or a combination thereof. The capping layer 605 may be formed using one of techniques well known to one of ordinary skill in the art of EUVL mask fabrication, for example, ion beam sputtering technique, PVD, or DC magnetron sputtering.

Next, an absorbing layer 606 is formed on the capping layer 605, as shown in FIG. 6A. The material for the absorbing layer 606 may be any material or combination of materials, which may include a bottom buffer layer or a top anti-reflecting layer that absorbs extreme ultra violet light, for example, chromium ("Cr"), tantalum nitride ("TaN"), titanium nitride ("TiN"), or any combination thereof. Criteria for selecting the material for the absorbing layer 606 are the substantially high absorbing ability of the material in a specified wavelength range, substantially high etching selectivity of the material relative to the other materials of the mask 600, and the substantially high chemical stability to avoid outgassing of the absorbing material. For an embodiment, the thickness of the absorbing layer 605 may be in the approximate range of 60 nm to 120 nm depending on the absorbing material. For example, the absorbing layer 606 of TaN may be in the approximate range of 70 nm to 80 nm, the absorbing layer 606 of Cr may be in the approximate range of 60 nm to 100 nm, and the absorbing layer 606 of TiN may be about 100 nm thick.

Figure 6B:
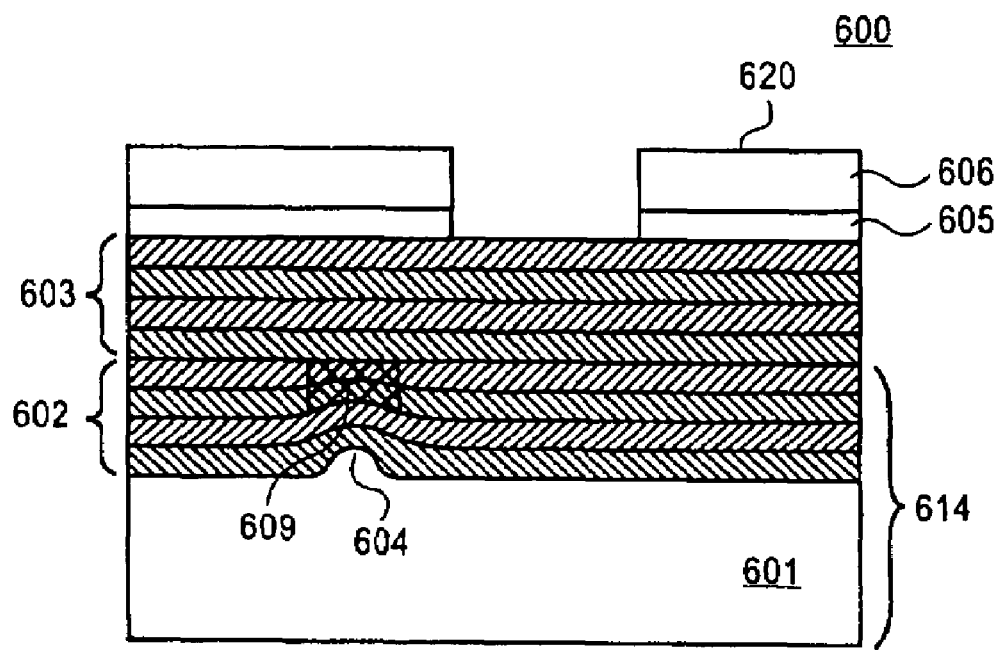
FIG. 6B is a view similar to FIG. 6A, after patterning and etching an absorbing layer and a capping layer to form a EUVL mask.

FIG. 6B is a cross-sectional view of the EUVL mask blank 600, after patterning and etching the absorbing layer 606 and the capping layer 605 down to the multilayer mirror 603 to form a EUVL mask 620. Processes for patterning and etching of the absorbing layer 606 and the capping layer 606 are known to one of ordinary skill in the art of transistor fabrication.

As shown in FIG. 6B, a substrate 614 of the EUVL mask 620 includes the correction layers 602 with the layer of the new material 609 formed over the non-flat region 604 on the substrate 601. The substrate 614 of the EUVL mask 620 is formed using processes and materials described above with respect to FIGS. 3-5.

For alternate embodiments, the methods described above may be used to correct non-flatness of the substrate of the masks for variety of applications, for example, Extreme Ultra Violet ("EUV") masks, Electron Projection Lithography ("EPL") masks, low energy EPL ("LEEPL") masks, imprint lithography masks, or any other masks.

What is claimed is:

1. A method to correct a non-flatness of a substrate of a mask, comprising:
providing a substrate having a first surface and a second surface, wherein the first surface includes a first non-flat region;
forming at least a pair of first correction layers on the first surface of the substrate, wherein the pair includes a second non-flat region over the first non-flat region;
forming at least a pair of second correction layers on the second surface of the substrate to compensate for stress induced on the substrate by the first correction layers; and
after the forming the at least the pair of second correction layers, heating a portion of the first correction layers over the second non-flat region to remove the second non-flat region leaving materials of the first correction layer and the substrate physically intact.

2. The method of claim 1, wherein a peak-to-valley distance of each of the first non-flat region and the second non-flat region is less than 100 nm.

3. The method of claim 1, wherein the second non-flat region is removed by changing a thickness of the portion of the first correction layers, the thickness of the first correction layers is defined by the peak-to-valley distance of the first non-flat region.

4. The method of claim 1, wherein the pair of the first correction layers includes a layer of a first material and a layer of a second material.

5. The method of claim 1, wherein the changing the thickness results from convening at least partially the portion of the first correction layers into a third material, wherein the third material includes the first material and the second material.

6. The method of claim 5, wherein the first material is a metal, the second material is silicon, and the third material is a silicide.

7. The method of claim 6, wherein the metal is molybdenum.

8. The method of claim 1, wherein each of the first correction layers of the pair is thin enough to convert at least partially the portion of the first correction layers into a third material.

9. The method of claim 1, wherein a thickness of the layer of the first material relates to the thickness of the layer of the second material to compensate for a stress on the substrate.

10. The method of claim 1, wherein the heating is performed by using a laser beam, an electron beam, an ion beam, or any combination thereof.

11. The method of claim 1, wherein the non-flat region is a bump defect.

12. A method, comprising:
polishing a first surface of a substrate having a first bump defect;
forming at least a pair of first correction layers on the first surface of the substrate, wherein the pair includes a second bump defect over the first bump defect;
forming at least a pair of second correction layers on a second surface of the substrate to compensate for stress induced on the substrate by the first correction layers; and
after the forming the at least the pair of second correction layers, heating with a beam a first portion of the first correction layers over the second bump defect to remove the second bump defect by reducing a thickness of the portion of the first correction layers over the first bump defect leaving materials of the first correction layers and the substrate physically intact.

13. The method of claim 12, wherein the thickness of the first correction layers is determined by a peak-to-valley distance of the bump defect.

14. The method of claim 12, wherein the pair of the first correction layers includes a layer of a metal and a layer of silicon.

15. The method of claim 14, wherein the metal is molybdenum.

16. The method of claim 12 further comprising
moving the beam over a third bump defect, wherein the third bump defect is formed on the first correction layers over a forth bump defect on the substrate;
heating with the beam a second portion of the first correction layers over the third bump defect to remove the third bump defect, wherein the moving and the heating are continuously repeated until all bump defects on the first correction layers are removed.

17. The method of claim 16, wherein the moving and the heating is controlled by an interferrogram of the first surface.

18. The method of claim 12 further comprising
forming a multilayer mirror on the first correction layers, wherein the multilayer mirror includes alternating layers of two materials, wherein a difference in indexes of refraction between the two materials is substantially large.

* * * * *

UNITED STATES PATENT AND TRADEMARK OFFICE
CERTIFICATE OF CORRECTION

| | | |
|---|---|---|
| PATENT NO. | : 7,534,532 B2 | Page 1 of 1 |
| APPLICATION NO. | : 11/045724 | |
| DATED | : May 19, 2009 | |
| INVENTOR(S) | : Yan | |

It is certified that error appears in the above-identified patent and that said Letters Patent is hereby corrected as shown below:

In column 14, at line 53 claim 5 delete, "convening" and insert -- converting --.

Signed and Sealed this

Fifth Day of October, 2010

David J. Kappos
*Director of the United States Patent and Trademark Office*